(12) United States Patent
Baptist et al.

(10) Patent No.: US 10,169,151 B2
(45) Date of Patent: Jan. 1, 2019

(54) UTILIZING REQUEST DEADLINES IN A DISPERSED STORAGE NETWORK

(71) Applicant: International Business Machines Corporation, Armonk, NY (US)

(72) Inventors: Andrew D. Baptist, Mt. Pleasant, WI (US); Greg R. Dhuse, Chicago, IL (US); Joseph M. Kaczmarek, Chicago, IL (US); Renars W. Narubin, Chicago, IL (US); Ilya Volvovski, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 169 days.

(21) Appl. No.: 15/249,630

(22) Filed: Aug. 29, 2016

(65) Prior Publication Data
US 2017/0123947 A1    May 4, 2017

Related U.S. Application Data

(60) Provisional application No. 62/248,752, filed on Oct. 30, 2015.

(51) Int. Cl.
*G06F 11/10* (2006.01)
*G06F 11/20* (2006.01)
(Continued)

(52) U.S. Cl.
CPC .......... *G06F 11/1092* (2013.01); *G06F 3/064* (2013.01); *G06F 3/0604* (2013.01);
(Continued)

(58) Field of Classification Search
CPC .... G06F 3/0604; G06F 3/0611; G06F 3/0619; G06F 3/064; G06F 3/0659; G06F 3/0665;
(Continued)

(56) References Cited

U.S. PATENT DOCUMENTS 4,092,732 A    5/1978    Ouchi
5,396,613 A *  3/1995    Hollaar ............... G06F 11/1402
                                                      714/4.1
(Continued)

OTHER PUBLICATIONS

Shamir; How to Share a Secret; Communications of the ACM; vol. 22, No. 11; Nov. 1979; pp. 612-613.
(Continued)

*Primary Examiner* — Paul Contino
(74) *Attorney, Agent, or Firm* — Garlick & Markison; Timothy W. Markison; Bruce E. Stuckman

(57) ABSTRACT

A method for execution by a dispersed storage and task (DST) processing unit includes generating a plurality of access requests that include an execution deadline time for transmission via a network to a corresponding subset of a plurality of storage units. A first deadline error notification is received via the network from a first storage unit of the first subset. A new one of the plurality of storage units not included in the first subset is selected in response to receiving the first deadline error notification. A new access request that includes an updated execution deadline time is generated for transmission to the new one of the plurality of storage units via the network. The new access request is based on a one of the first plurality of access requests sent to the first storage unit of the first subset.

18 Claims, 6 Drawing Sheets

(51) Int. Cl.
*H04L 29/08* (2006.01)
*G06F 3/06* (2006.01)
*H04L 12/26* (2006.01)
*H03M 13/15* (2006.01)
*H03M 13/37* (2006.01)

(52) U.S. Cl.
CPC ............ *G06F 3/067* (2013.01); *G06F 3/0611* (2013.01); *G06F 3/0619* (2013.01); *G06F 3/0659* (2013.01); *G06F 3/0665* (2013.01); *G06F 3/0689* (2013.01); *G06F 11/2094* (2013.01); *H03M 13/1515* (2013.01); *H03M 13/3761* (2013.01); *H04L 43/0864* (2013.01); *H04L 43/16* (2013.01); *H04L 67/1008* (2013.01); *H04L 67/1097* (2013.01); *G06F 2201/805* (2013.01)

(58) Field of Classification Search
CPC .... G06F 3/067; G06F 3/0689; G06F 11/0727; G06F 11/0745; G06F 11/3404; G06F 11/3072; G06F 11/1092; G06F 11/2094; H04L 67/1097; H04L 67/1008; H04L 43/0864; H04L 43/16; H03M 13/1515; H03M 13/3761
See application file for complete search history.

(56) References Cited

U.S. PATENT DOCUMENTS

| | | | |
|---|---|---|---|
| 5,454,101 A | 9/1995 | Mackay et al. | |
| 5,485,474 A | 1/1996 | Rabin | |
| 5,758,057 A * | 5/1998 | Baba | G06F 11/0727 711/114 |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 7,752,362 B2 * | 7/2010 | Nishimoto | G06F 3/0611 710/5 |
| 8,307,031 B1 * | 11/2012 | Grieve | H04L 69/28 709/203 |
| 8,977,897 B2 * | 3/2015 | Tamura | G06F 11/2058 707/610 |
| 9,298,376 B2 * | 3/2016 | Colgrove | G06F 3/061 |
| 9,843,418 B2 * | 12/2017 | Hives | H04L 1/08 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0038830 A1 * | 2/2007 | Iwamitsu | G06F 3/0611 711/167 |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0055376 A1 * | 3/2011 | Little | G06F 9/466 709/224 |
| 2012/0159094 A1 * | 6/2012 | Bridge, Jr. | G06F 11/3433 711/158 |
| 2013/0097118 A1 * | 4/2013 | Jenkins | G06F 3/0611 707/634 |
| 2013/0290703 A1 * | 10/2013 | Resch | H04L 67/1097 713/155 |
| 2014/0013187 A1 * | 1/2014 | Blaunstein | G06F 13/1689 714/773 |
| 2014/0068259 A1 * | 3/2014 | Resch | G06F 21/6272 713/167 |
| 2014/0298085 A1 * | 10/2014 | Baptist | G06F 11/0793 714/6.2 |
| 2014/0351674 A1 * | 11/2014 | Grube | G06F 11/1076 714/764 |
| 2015/0006830 A1 * | 1/2015 | Shin | G06F 3/0659 711/154 |
| 2017/0115891 A1 * | 4/2017 | O'Krafka | G06F 3/0604 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

(56) References Cited

OTHER PUBLICATIONS

Wildi; Java iSCSi Initiator; Master Thesis; Department of Computer and Information Science, University of Konstanz; Feb. 2007; 60 pgs.
Legg; Lightweight Directory Access Protocol (LDAP): Syntaxes and Matching Rules; IETF Network Working Group; RFC 4517; Jun. 2006; pp. 1-50.
Zeilenga; Lightweight Directory Access Protocol (LDAP): Internationalized String Preparation; IETF Network Workmg Group; RFC 4518; Jun. 2006; pp. 1-14.
Smith; Lightweight Directory Access Protocol (LDAP): Uniform Resource Locator; IETF Network Working Group; RFC 4516; Jun. 2006; pp. 1-15.
Smith; Lightweight Directory Access Protocol (LDAP): String Representation of Search Filters; IETF Network Working Group; RFC 4515; Jun. 2006; pp. 1-12.
Zeilenga; Lightweight Directory Access Protocol (LDAP): Directory Information Models; IETF Network Working Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

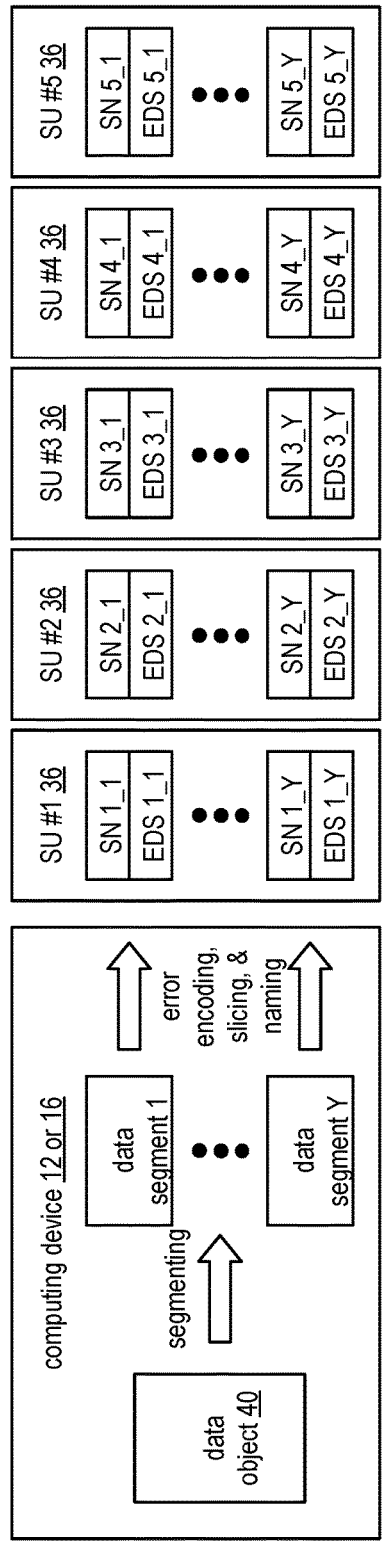
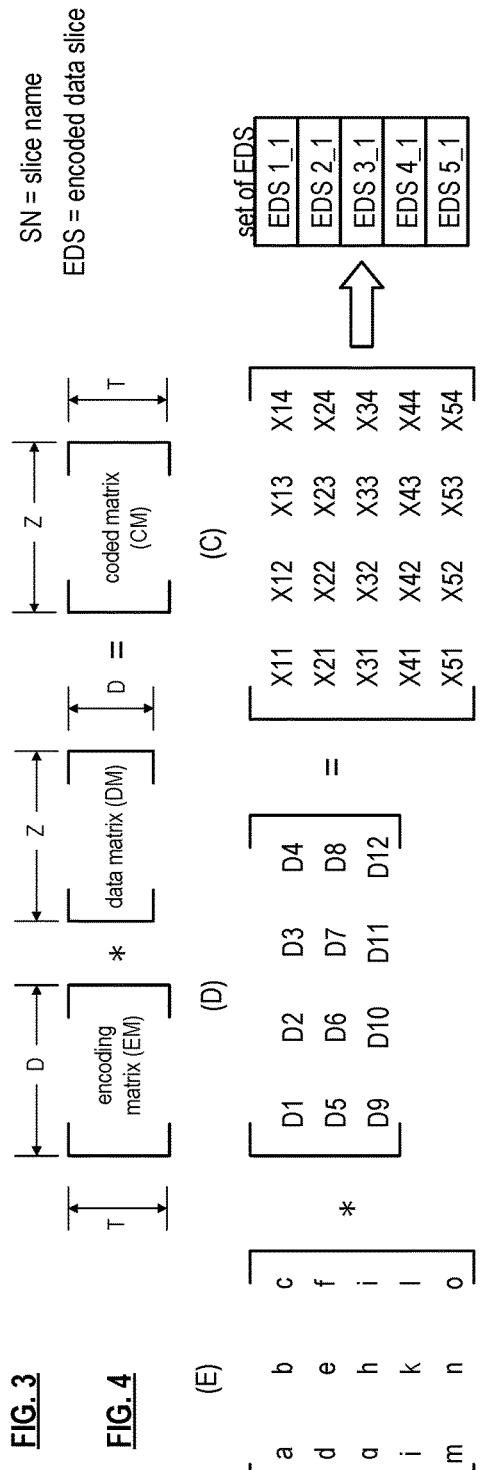
FIG. 3
FIG. 4
FIG. 5
FIG. 6

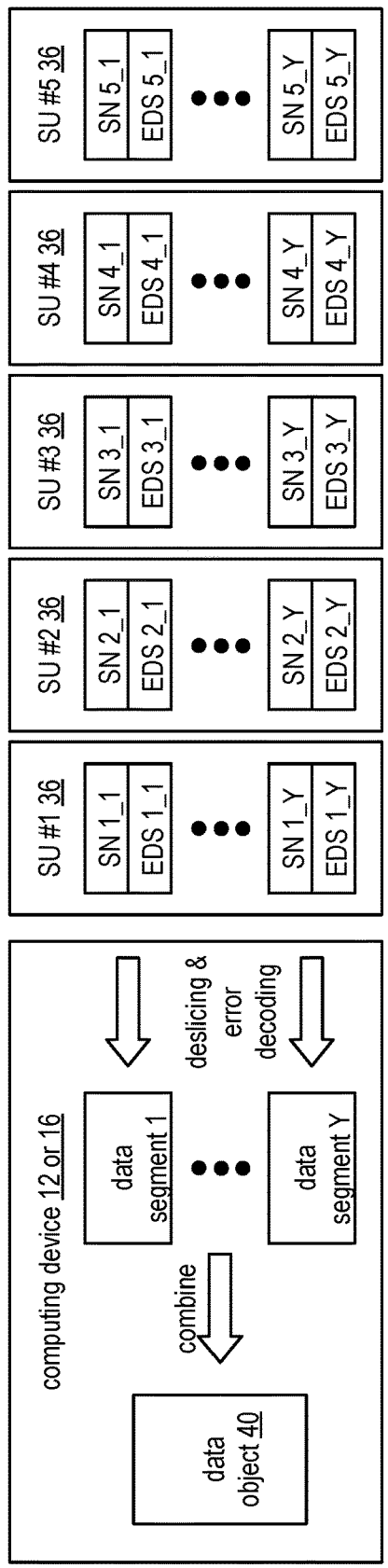

UTILIZING REQUEST DEADLINES IN A DISPERSED STORAGE NETWORK

CROSS-REFERENCE TO RELATED APPLICATIONS

The present U.S. Utility Patent Application claims priority pursuant to 35 U.S.C. § 119(e) to U.S. Provisional Application No. 62/248,752, entitled "MIGRATING DATA IN A DISPERSED STORAGE NETWORK", filed Oct. 30, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

DETAILED DESCRIPTION OF THE INVENTION

Figure 1:
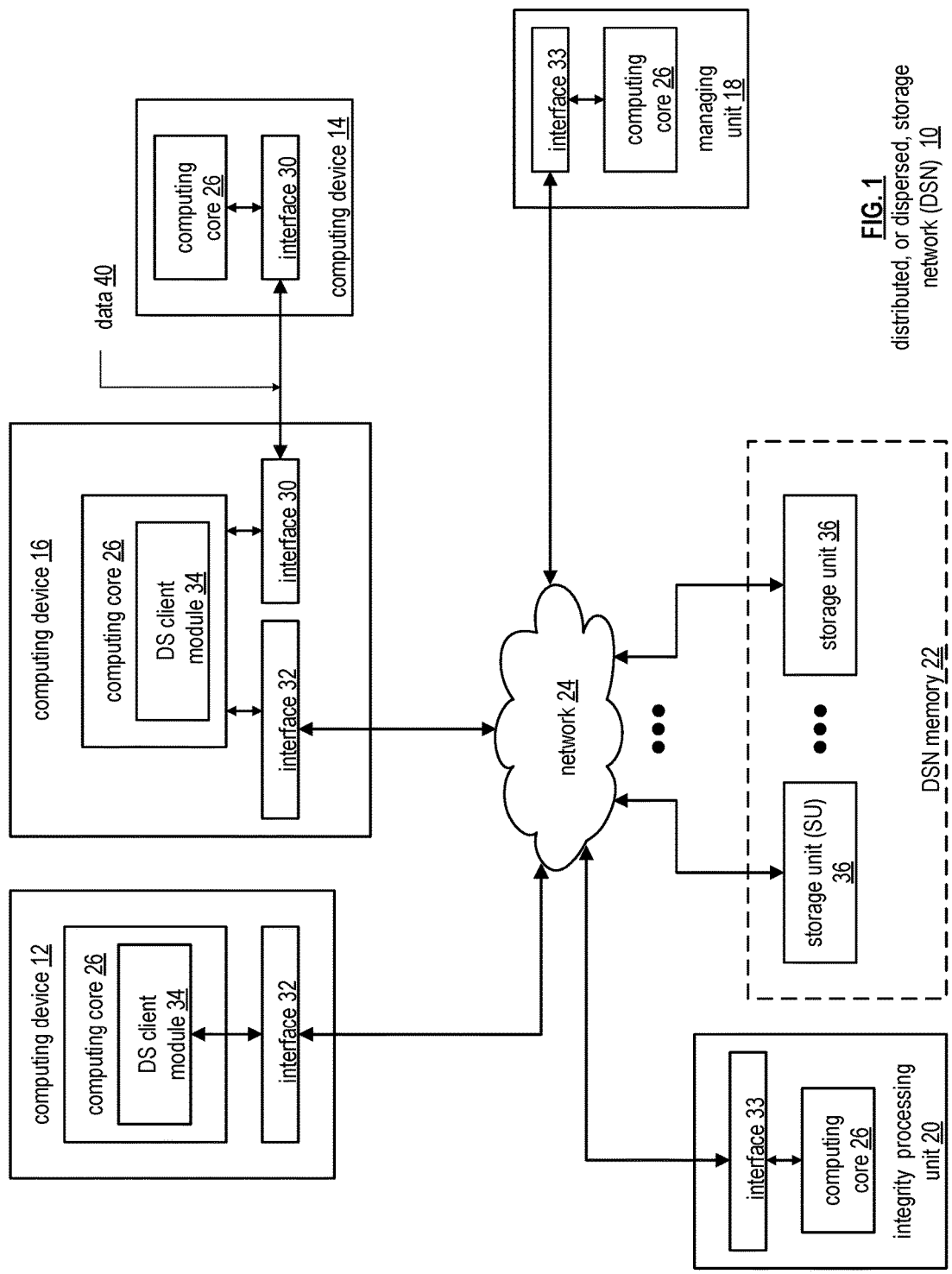
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
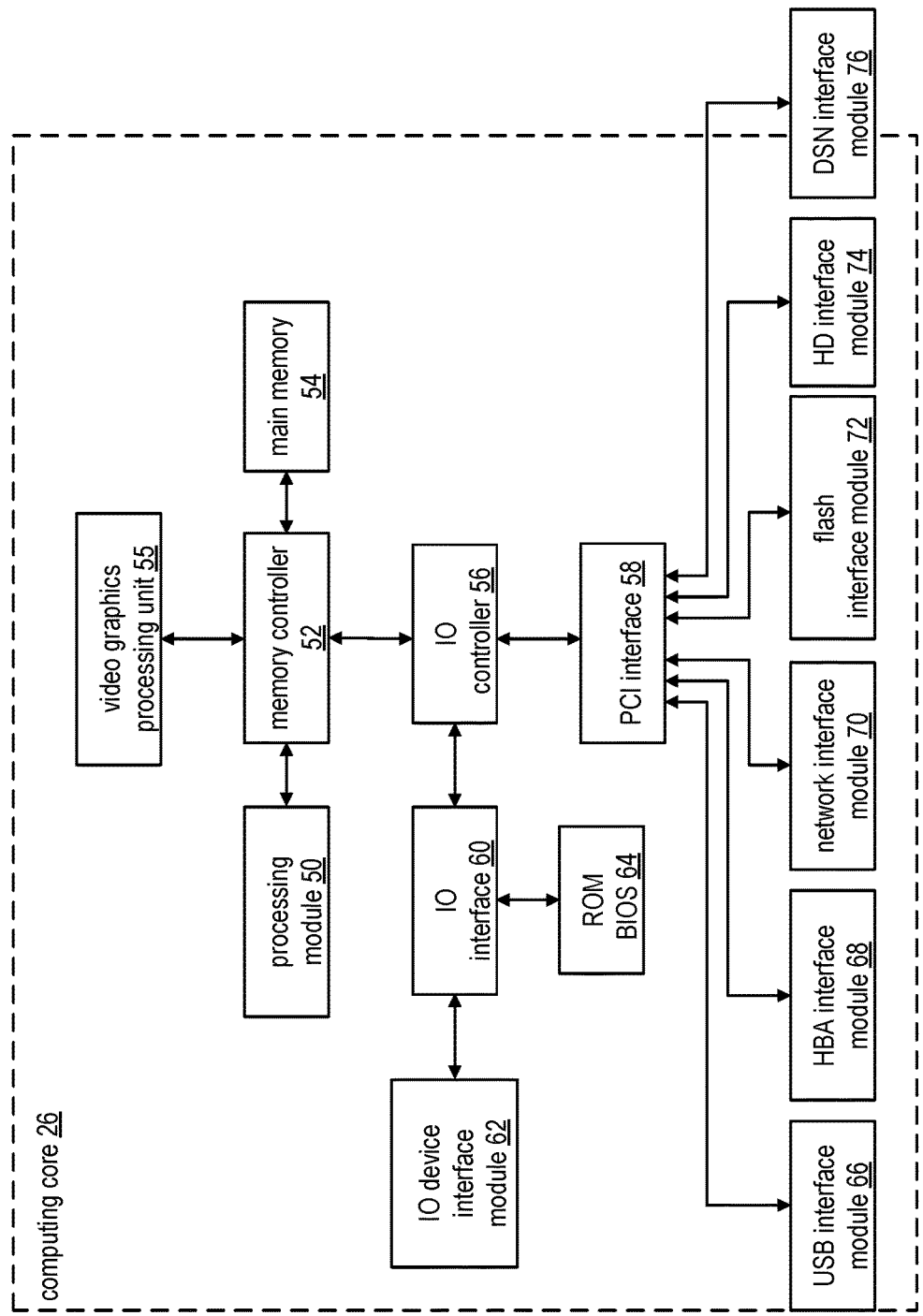
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voiceto-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the 10 device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
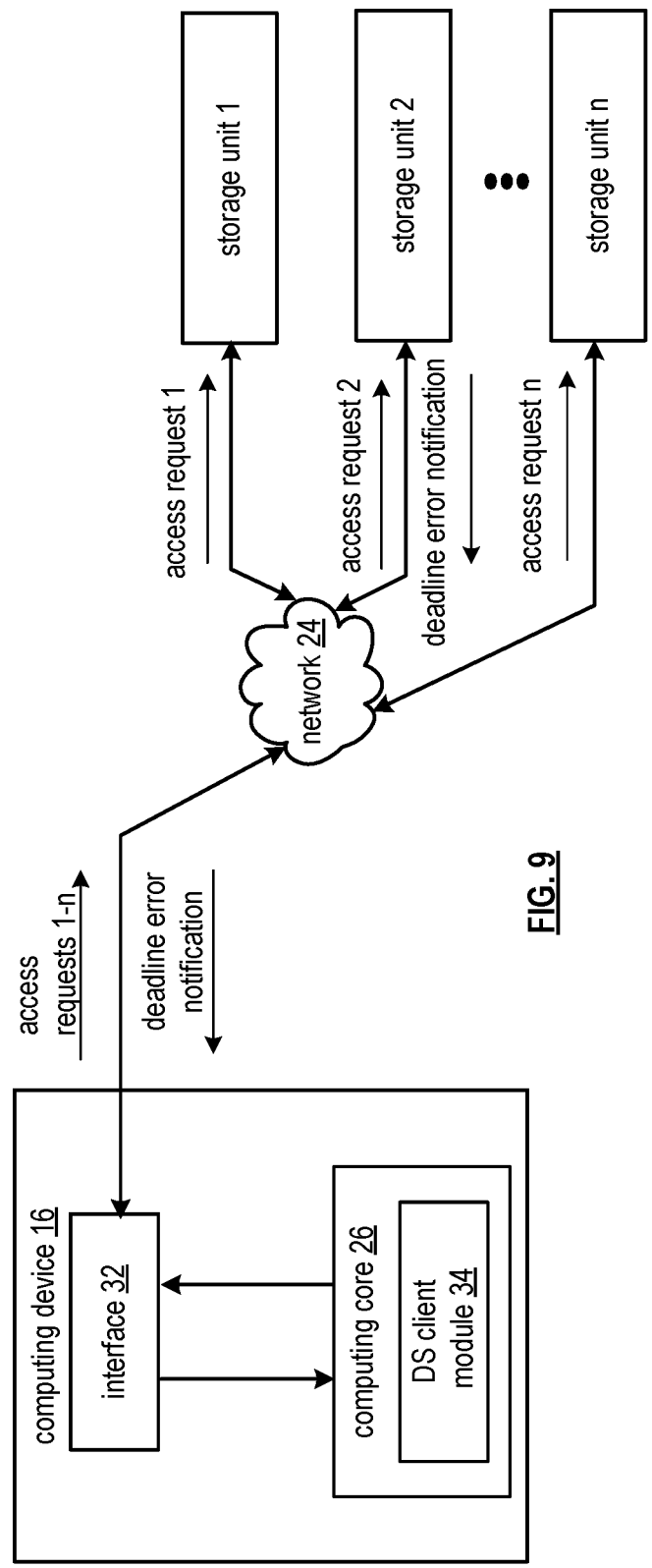
FIG. 9 is a schematic block diagram of an embodiment of a dispersed or distributed storage network (DSN) in accordance with the present invention.

FIG. 9 is a schematic block diagram of another embodiment of a dispersed storage network (DSN) that includes a computing device 16 of FIG. 1, the network 24 of FIG. 1, and a plurality of storage units 1-$n$. The computing device 16 can include the interface 32 of FIG. 1, the computing core 26 of FIG. 1, and the DS client module 34 of FIG. 1. The computing device 16 can function as a dispersed storage processing agent for computing device 14 as described previously, and may hereafter be interchangeably referred to as a distributed storage and task (DST) processing unit. Each storage unit may be implemented utilizing the storage unit 36 of FIG. 1. The DSN functions to utilize access request deadlines.

In various embodiments, request deadlines are utilized when executing access requests, allowing the DST processing unit can adapt to missed expectations in request time processing. When multiple related requests are generated by the DST processing unit to execute an access request of a data object, such as when read threshold read requests are created for slices of the same source, a deadline can be established for when the processing should be completed. Storage units can determine if they expect to complete the request on time, for example, by generating an estimated completion time and comparing it to the execution deadline. The storage unit can determine if it expects to complete the request on time before execution begins, or during execution. In various embodiments, the storage unit can estimate deadlines multiple times during execution based on the progress of the execution at each of the multiple times. If a storage unit determines it likely will not complete processing of the request by that deadline, it can transmit a deadline error notification back to the DST processing unit. In this manner, the DST processing unit can know when a request will likely take longer than expected well before it otherwise might have decided that a response is overdue. The deadline error notifications, when they occur on other storage units, can be sent back as additional protocol responses, to notify the DST processing unit of potential missed deadlines before the actual response is returned.

To accomplish this, in various embodiments, the DST processing unit can determine deadline information for a data access request, based on a completion deadline, a time remaining value, an identifier in the access request, a desired time frame to complete accessing of data, and/or DSN performance data. This deadline information can indicate an execution deadline time. A threshold number (e.g., read threshold, write threshold) of storage units of the set of storage units can be selected for accessing of the data based on storage unit performance level, storage unit capacity level, and/or an association with the data. A corresponding threshold number of deadline access requests can to be generated, and these access requests can include the deadline information, a request ID, and/or slice information such as an encoded slice, a slice name, and/or a request type. The access requests can be transmitted to the selected threshold number of storage units. A deadline error notification can be received in response from one or more of the storage units. The deadline error notification can include a request ID, an error indicator, the deadline info, a forecasted completion time, and/or an estimated time remaining in the deadline error notification. In response to receiving a threshold number of favorable access responses, or in response to receiving no deadline error notifications, the DST processing unit can process the received access responses in accordance with the data access request as usual, for example, by decoding received slices to reproduce data for a read data access request and/or indicating completion of writing for a write data access request.

In response to receiving one or more deadline error notifications, the DST processing unit can determine a next step. In various embodiments, the DST processing unit can generate new access requests to one or more new storage units in response to the notification, for example, sending one of a plurality of write requests corresponding to encoded slices of a data object that was originally sent to one of the storage units from which a deadline error notification was received to a different storage unit that did not originally receive one of the plurality of write requests. The new storage units can be selected based on performance, capacity, data association, and/or availability. The DST processing unit can include an updated execution deadline in these new access requests, and in various embodiments, can also send the updated deadline to the original set of storage units. This strategy can include reissuing new read requests to other storage units and/or sending additional write requests in a Trimmed Writes or Target Width write strategy to other storage units.

In various embodiments, the DST processing unit can instead determine that the best course of action is to continue executing the request anyways, despite the deadline error notification. In this case, the DST processing unit can send a notification to one or more storage units from which the deadline error notification was received indicating that they should proceed with the access, and in various embodiments, can send an updated deadline with this notification. In various embodiments, the DST processing unit can cancel the request in response to receiving the deadline error notification by sending a plurality of cancellation requests to the plurality of storage units that received the original set of access requests. In various embodiments, a storage unit that sends a deadline error notification can automatically forego continuing execution of the access after the notification is transmitted. In other embodiments, the storage unit can wait in an idle mode for a proceed with execution notification from the DST processing unit. In other embodiments, the storage unit can continue processing the request after transmitting the deadline error notification until a cancellation notification is received.

In various embodiments, the DST processing unit can decide the appropriate course of action in response to receiving a deadline error notification by determining a cost associated with the missed deadline, and determining the course of action based on this cost. For example, the cost associated with the missed deadline can be compared to a threshold cost of generating new access requests, and the DST processing unit can determine that the best course of action is to generate new access requests to one or more storage units accordingly if the missed deadline cost compares favorably to this threshold. For example, the missed deadline cost can compare favorably to this threshold to indicate that it is more favorable to generate new access requests rather than continue with original access requests being executed by the original set of storage units based on an estimated execution time indicated by one or more storage units from which the deadline error notification was received, access priority, the access type, performance data corresponding to one or more storage units from which the deadline error notification was received, and/or performance data corresponding to a new one or more storage units that new requests would be transmitted to accordingly, etc. When the missed deadline cost compares unfavorably to the threshold, the DST processing unit can cancel the request or allow the request to continue via the original set of storage units.

In various embodiments, a DST processing unit can utilize unique combination reads (UCR) when encoding a data object as a plurality of encoded data slices distributed amongst a plurality of storage units, and utilize the access duration data of the storage units when recovering the data object. The number of data slices needed to decode and regenerate the original data object is less than the total number of data slices stored for the object. In various embodiments, k slices are necessary to decode the object, and there are n slices total. In various embodiments, any combination of k slices can be used jointly to decode the object. Each combination of k slices for a data object can be assigned to a particular requesting entity, where the requesting entity can be, for example, a user device 12-14. In such cases, the combination of k slices assigned to the communicating for the data object can be a unique combination of read requests for the object if the total number of requesting entities does not exceed C(n,k), the total number of possible combinations of k slices from the total number of slices n. In various embodiments, the number of possible read combinations k can correspond to the number of users. In such embodiments where UCR is utilized, the DST processing unit can select the particular combination of k slices to be read based on previous access duration times corresponding to the n storage units. For example, the combination of k slices stored in the storage units with the fastest past access durations can be selected to be read. In various embodiments where the DST processing unit generates new access requests to one or more new storage units in response to the notification, the DST processing unit can select the new storage units based on a UCR protocol. For example, the access request associated with the data object can include a read request, and the new storage units can be selected based on a different unique read combination. For example, this different unique read combination can be selected based on the original set of storage units to which the read request was transmitted, and from which no missing deadline notification was received. One or more new storage units can be selected based on a subset of storage units required to complete a new unique read combination. In some embodiments, the DST processing unit can transmit a cancellation request to one or more of the original set of storage units, even if no missing deadline notification was received from these storage units, in response to selecting a different unique read combination that does not include these storage units.

In various embodiments, multiple layers in the system can implement this deadline handling and process time estimation logic. When requests are generated and an execution deadline is established, if any layer determines it likely will not complete processing of the request by that deadline, a notification can be received by the DST processing unit indicating that the layer will miss the deadline. In various embodiments, layers included within in the DST processing unit itself are included in the system layers and can also implement this deadline processing. As each layer completes its portion of executing the request, the requests are passed to the next layer. For example, these layers can include grid layer logic, network queues, network transmission, storage unit request handling, an IO scheduler, memory device subsystem, response network queue, and/or network transmission. Each layer, upon receiving the request, can analyze the current deadline and perform an estimate as to how long the request will remain within this layer. This time estimate can then be added to the current time. If the deadline is exceeded by the current time plus the estimated time in this layer, then a missed-deadline notification can be sent back to the DST processing unit. An alternate strategy for computing missed deadlines which supports unsynchronized clocks can include instead transmitting a "time remaining for processing" in the request. Each layer can subtract its time estimate or actual time spent from the time remaining for processing before sending the request to the next layer. If the time estimate at any layer exceeds the time remaining, then a missed-deadline notification is sent back to the DST processing unit.

In various embodiments, a processing system of a dispersed storage and task (DST) processing unit includes at least one processor and a memory that stores operational instructions, that when executed by the at least one processor cause the processing system to generate a first plurality of access requests that include a first execution deadline time for transmission via a network to a corresponding first subset of a plurality of storage units. A first deadline error notification is received via the network from a first storage unit of the first subset. A new one of the plurality of storage units not included in the first subset is selected in response to receiving the first deadline error notification. A new access request that includes an updated execution deadline time is generated for transmission to the new one of the plurality of storage units via the network. The new access request is based on a one of the first plurality of access requests sent to the first storage unit of the first subset.

In various embodiments, the first deadline error notification is transmitted by the one of the plurality of storage units in response to an estimated completion time comparing unfavorably to the first execution deadline time. In various embodiments, the first deadline error notification is transmitted by the one of the plurality of storage units prior to attempting to execute the access request. In various embodiments, a plurality of execution deadline update notifications that include the updated execution deadline time are generated for transmission via the network to the storage units of the first subset from which the first deadline error notification was not received. In various embodiments, the first execution deadline time is determined based on performance data corresponding to the first subset of the plurality of storage units, an access type corresponding to the first plurality of access requests, and/or an access priority corresponding to the first plurality of access requests. In various embodiments, the updated execution deadline time is determined based on performance data corresponding to the one of the plurality of storage units, an access type corresponding to the new access request, and/or an access priority corresponding to the first plurality of access requests.

In various embodiments, the first plurality of access requests are generated in response to a request to read a data object, and the new one of the plurality of storage units is selected based on the first subset of the plurality of storage units, the one of the plurality of storage units from which the first deadline error notification was received, and a unique combination reads (UCR) protocol. In various embodiments, a new subset by removing the first storage unit from the first subset and including a new subset of the plurality of storage units that includes the new one of the plurality of storage units. The new subset is based on a unique read combination of the data object. A new access request is generated for transmission via the network to each corresponding storage unit in the new subset.

In various embodiments, a missed deadline cost value is calculated in response to receiving the first deadline error notification. The missed deadline cost value is compared to a new request cost threshold. The new one of the plurality of storage units is selected and the new access request is generated for transmission to the new one of the of the plurality of storage units when the missed deadline cost value compares favorably to the new request cost threshold. In various embodiments, a plurality of access cancellation requests are generated for transmission via the network to storage units of the first subset from which the first deadline error notification was not received when the missed deadline cost value compares unfavorably to the new request cost threshold. In various embodiments, a proceed with execution notification is generated for transmission via the network to the first storage unit of the first subset indicating a request to continue executing the access request when the missed deadline cost value compares unfavorably to the new request cost threshold. In various embodiments, the first deadline error notification includes an estimated completion time, and the missed deadline cost value is calculated based on a difference between the estimated completion time and the first execution deadline time. In various embodiments, the missed deadline cost value is calculated based on an access type corresponding to the first plurality of access requests, an access priority corresponding to the first plurality of access requests, performance data corresponding to the first storage unit of the first subset, and/or performance data corresponding to at least one of the plurality of storage units not included in the first subset. In various embodiments, a plurality of deadline error notifications are received via the network, and the missed deadline cost value is calculated based on a number of deadline error notifications received and/or performance data corresponding to at least one of the plurality of storage units from which the plurality of deadline error notifications was received.

In various embodiments, a second plurality of access requests that include a second execution deadline time are generated for transmission via a network to a corresponding second subset of a plurality of storage units. A second deadline error notification is received via the network based on an estimated completion time comparing unfavorably to the second execution deadline time at one of a plurality of system layers. In various embodiments, the plurality of system layers includes a grid layer logic layer, a network queue layer, a network transmission layer, a storage unit request handling layer, an IO scheduling layer, a memory device subsystem layer, a response network queue layer, and/or a network transmission layer. In various embodiments, the second plurality of access requests include a plurality of execution deadline times corresponding to each of the plurality of system layers, and the second deadline error notification is based on an estimated completion time of one of the plurality of system layers comparing unfavorably to the corresponding one of a plurality of execution deadline times.

Figure 10:
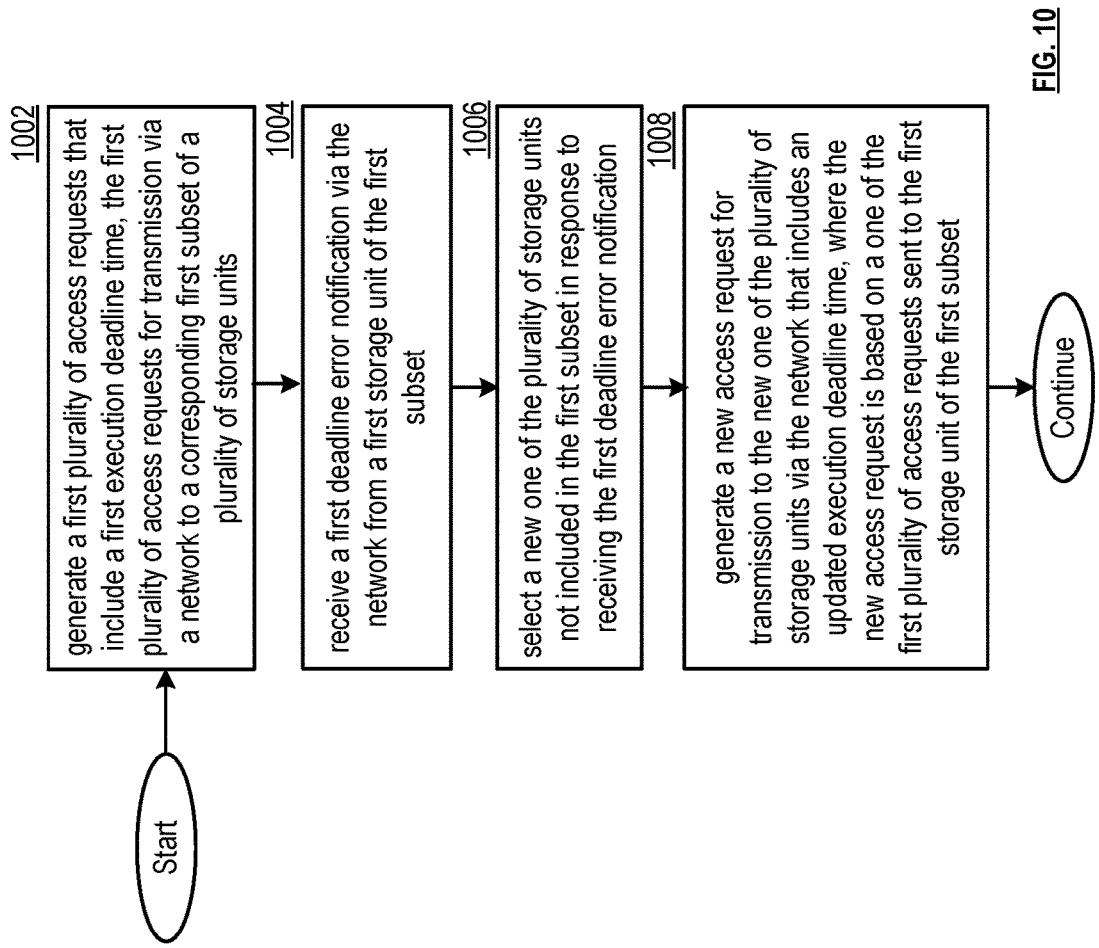
FIG. 10 is a logic diagram of an example of a method of utilizing request deadlines in accordance with the present invention.

FIG. 10 is a flowchart illustrating an example of utilizing request deadlines when executing access requests. In particular, a method is presented for use in association with one or more functions and features described in conjunction with FIGS. 1-9, for execution by a dispersed storage and task (DST) processing unit that includes a processor or via another processing system of a dispersed storage network that includes at least one processor and memory that stores instruction that configure the processor or processors to perform the steps described below. Step 1002 includes generating a first plurality of access requests that include a first execution deadline time for transmission via a network to a corresponding first subset of a plurality of storage units. Step 1004 includes receiving a first deadline error notification via the network from a first storage unit of the first subset. Step 1006 includes selecting a new one of the plurality of storage units not included in the first subset in response to receiving the first deadline error notification. Step 1008 includes generating a new access request for transmission to the new one of the plurality of storage units via the network that includes an updated execution deadline time, where the new access request is based on a one of the first plurality of access requests sent to the first storage unit of the first subset.

In various embodiments, the first deadline error notification is transmitted by the one of the plurality of storage units in response to an estimated completion time comparing unfavorably to the first execution deadline time. In various embodiments, the first deadline error notification is transmitted by the one of the plurality of storage units prior to attempting to execute the access request. In various embodiments, a plurality of execution deadline update notifications that include the updated execution deadline time are generated for transmission via the network to the storage units of the first subset from which the first deadline error notification was not received. In various embodiments, the first execution deadline time is determined based on performance data corresponding to the first subset of the plurality of storage units, an access type corresponding to the first plurality of access requests, and/or an access priority corresponding to the first plurality of access requests. In various embodiments, the updated execution deadline time is determined based on performance data corresponding to the one of the plurality of storage units, an access type corresponding to the new access request, and/or an access priority corresponding to the first plurality of access requests.

In various embodiments, the first plurality of access requests are generated in response to a request to read a data object, and the new one of the plurality of storage units is selected based on the first subset of the plurality of storage units, the one of the plurality of storage units from which the first deadline error notification was received, and a unique combination reads (UCR) protocol. In various embodiments, a new subset by removing the first storage unit from the first subset and including a new subset of the plurality of storage units that includes the new one of the plurality of storage units. The new subset is based on a unique read combination of the data object. A new access request is generated for transmission via the network to each corresponding storage unit in the new subset.

In various embodiments, a missed deadline cost value is calculated in response to receiving the first deadline error notification. The missed deadline cost value is compared to a new request cost threshold. The new one of the plurality of storage units is selected and the new access request is generated for transmission to the new one of the of the plurality of storage units when the missed deadline cost value compares favorably to the new request cost threshold. In various embodiments, a plurality of access cancellation requests are generated for transmission via the network to storage units of the first subset from which the first deadline error notification was not received when the missed deadline cost value compares unfavorably to the new request cost threshold. In various embodiments, a proceed with execution notification is generated for transmission via the network to the first storage unit of the first subset indicating a request to continue executing the access request when the missed deadline cost value compares unfavorably to the new request cost threshold. In various embodiments, the first deadline error notification includes an estimated completion time, and the missed deadline cost value is calculated based on a difference between the estimated completion time and the first execution deadline time. In various embodiments, the missed deadline cost value is calculated based on an access type corresponding to the first plurality of access requests, an access priority corresponding to the first plurality of access requests, performance data corresponding to the first storage unit of the first subset, and/or performance data corresponding to at least one of the plurality of storage units not included in the first subset. In various embodiments, a plurality of deadline error notifications are received via the network, and the missed deadline cost value is calculated based on a number of deadline error notifications received and/or performance data corresponding to at least one of the plurality of storage units from which the plurality of deadline error notifications was received.

In various embodiments, a second plurality of access requests that include a second execution deadline time are generated for transmission via a network to a corresponding second subset of a plurality of storage units. A second deadline error notification is received via the network based on an estimated completion time comparing unfavorably to the second execution deadline time at one of a plurality of system layers. In various embodiments, the plurality of system layers includes a grid layer logic layer, a network queue layer, a network transmission layer, a storage unit request handling layer, an IO scheduling layer, a memory device subsystem layer, a response network queue layer, and/or a network transmission layer. In various embodiments, the second plurality of access requests include a plurality of execution deadline times corresponding to each of the plurality of system layers, and the second deadline error notification is based on an estimated completion time of one of the plurality of system layers comparing unfavorably to the corresponding one of a plurality of execution deadline times.

In various embodiments, a non-transitory computer readable storage medium includes at least one memory section that stores operational instructions that, when executed by a processing system of a dispersed storage network (DSN) that includes a processor and a memory, causes the processing system to generate a first plurality of access requests that include a first execution deadline time for transmission via a network to a corresponding first subset of a plurality of storage units. A first deadline error notification is received via the network from a first storage unit of the first subset. A new one of the plurality of storage units not included in the first subset is selected in response to receiving the first deadline error notification. A new access request that includes an updated execution deadline time is generated for transmission to the new one of the plurality of storage units via the network. The new access request is based on a one of the first plurality of access requests sent to the first storage unit of the first subset.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage and task (DST) processing unit that includes a processor, the method comprises:
    generating a first plurality of access requests that include a first execution deadline time, the first plurality of access requests for transmission via a network to a corresponding first subset of a plurality of storage units;
    receiving a first deadline error notification via the network from a first storage unit of the first subset;
    calculating a missed deadline cost value in response to receiving the first deadline error notification;
    comparing the missed deadline cost value to a new request cost threshold;
    selecting a new one of the plurality of storage units not included in the first subset in response to receiving the first deadline error notification;
    generating a new access request for transmission to the new one of the plurality of storage units via the network that includes an updated execution deadline time, wherein the new access request is based on a one of the first plurality of access requests sent to the first storage unit of the first subset, wherein the new one of the plurality of storage units is selected and the new access request is generated for transmission to the new one of the of the plurality of storage units when the missed deadline cost value compares favorably to the new request cost threshold; and
    generating a proceed with execution notification for transmission via the network to the first storage unit of the first subset indicating a request to continue executing the access request when the missed deadline cost value compares unfavorably to the new request cost threshold.

2. The method of claim 1, wherein the first deadline error notification is transmitted by the one of the plurality of storage units in response to an estimated completion time comparing unfavorably to the first execution deadline time.

3. The method of claim 2, wherein the first deadline error notification is transmitted by the one of the plurality of storage units prior to attempting to execute the access request.

4. The method of claim 1, further comprising:
generating a plurality of execution deadline update notifications that include the updated execution deadline time for transmission via the network to the storage units of the first subset from which the first deadline error notification was not received.

5. The method of claim 1, further comprising:
determining the first execution deadline time based on at least one of: performance data corresponding to the first subset of the plurality of storage units, an access type corresponding to the first plurality of access requests, or an access priority corresponding to the first plurality of access requests.

6. The method of claim 1, further comprising:
determining the updated execution deadline time based on at least one of: performance data corresponding to the one of the plurality of storage units, an access type corresponding to the new access request, or an access priority corresponding to the first plurality of access requests.

7. The method of claim 1, wherein the first plurality of access requests are generated in response to a request to read a data object, and wherein the new one of the plurality of storage units is selected based on the first subset of the plurality of storage units, the one of the plurality of storage units from which the first deadline error notification was received, and a unique combination reads (UCR) protocol.

8. The method of claim 7, further comprising:
generating a new subset by removing the first storage unit from the first subset and including a new subset of the plurality of storage units that includes the new one of the plurality of storage units, wherein the new subset is based on a unique read combination of the data object; and
generating a new access request for transmission via the network to each corresponding storage unit in the new subset.

9. The method of claim 1, further comprising:
generating a second plurality of access requests that include a second execution deadline time, the second plurality of access requests for transmission via the network to a corresponding second subset of the plurality of storage units;
receiving a second deadline error notification via the network from a second storage unit of the second subset;
calculating a second missed deadline cost value in response to receiving the second deadline error notification;
comparing the second missed deadline cost value to the new request cost threshold; and
generating a plurality of access cancellation requests for transmission via the network to storage units of the second subset from which the second deadline error notification was not received in response to the second missed deadline cost value comparing unfavorably to the new request cost threshold.

10. The method of claim 1, wherein the first deadline error notification includes an estimated completion time, and wherein the missed deadline cost value is calculated based on a difference between the estimated completion time and the first execution deadline time.

11. The method of claim 1, wherein the missed deadline cost value is calculated based on at least one of: an access type corresponding to the first plurality of access requests, an access priority corresponding to the first plurality of access requests, performance data corresponding to the first storage unit of the first subset, or performance data corresponding to at least one of the plurality of storage units not included in the first subset.

12. The method of claim 1, further comprising:
receiving a plurality of deadline error notifications via the network;
wherein the missed deadline cost value is calculated based on at least one of: a number of deadline error notifications received, or performance data corresponding to at least one of the plurality of storage units from which the plurality of deadline error notifications was received.

13. The method of claim 1, further comprising:
generating a second plurality of access requests that include a second execution deadline time for transmission via a network to a corresponding second subset of a plurality of storage units; and
receiving a second deadline error notification via the network based on an estimated completion time comparing unfavorably to the second execution deadline time at one of a plurality of system layers.

14. The method of claim 13, wherein the plurality of system layers includes at least one of: a grid layer logic layer, a network queue layer, a network transmission layer, a storage unit request handling layer, an IO scheduling layer, a memory device subsystem layer, a response network queue layer, or a network transmission layer.

15. The method of claim 13, wherein the second plurality of access requests include a plurality of execution deadline times corresponding to each of the plurality of system layers, and wherein the second deadline error notification is based on an estimated completion time of one of the plurality of system layers comparing unfavorably to the corresponding one of a plurality of execution deadline times.

16. A processing system of a dispersed storage and task (DST) processing unit comprises:
at least one processor;
a memory that stores operational instructions, that when executed by the at least one processor cause the processing system to:
generate a first plurality of access requests that include a first execution deadline time, the first plurality of access requests for transmission via a network to a corresponding first subset of a plurality of storage units;
receive a first deadline error notification via the network from a first storage unit of the first subset;
calculate a missed deadline cost value in response to receiving the first deadline error notification;
compare the missed deadline cost value to a new request cost threshold;
select a new one of the plurality of storage units not included in the first subset in response to receiving the first deadline error notification;
generate a new access request for transmission to the new one of the plurality of storage units via the network that includes an updated execution deadline time, wherein the new access request is based on a one of the first plurality of access requests sent to the first storage unit of the first subset, wherein the new one of the plurality of storage units is selected and the new access request is generated for transmission to the new one of the of the plurality of storage units when the missed deadline cost value compares favorably to the new request cost threshold; and generate a proceed with execution notification for transmission via the network to the first storage unit of the first subset indicating a request to continue executing the access request when the missed deadline cost value compares unfavorably to the new request cost threshold.

17. The processing system of claim 16, wherein the first plurality of access requests are generated in response to a request to read a data object, and wherein the new one of the plurality of storage units is selected based on the first subset of the plurality of storage units, the one of the plurality of storage units from which the first deadline error notification was received, and a unique combination reads (UCR) protocol.

18. A non-transitory computer readable storage medium comprises:

at least one memory section that stores operational instructions that, when executed by a processing system of a dispersed storage network (DSN) that includes a processor and a memory, causes the processing system to:

generate a first plurality of access requests that include a first execution deadline time, the first plurality of access requests for transmission via a network to a corresponding first subset of a plurality of storage units;

receive a first deadline error notification via the network from a first storage unit of the first subset;

calculate a missed deadline cost value in response to receiving the first deadline error notification;

compare the missed deadline cost value to a new request cost threshold;

select a new one of the plurality of storage units not included in the first subset in response to receiving the first deadline error notification;

generate a new access request for transmission to the new one of the plurality of storage units via the network that includes an updated execution deadline time, wherein the new access request is based on a one of the first plurality of access requests sent to the first storage unit of the first subset, wherein the new one of the plurality of storage units is selected and the new access request is generated for transmission to the new one of the of the plurality of storage units when the missed deadline cost value compares favorably to the new request cost threshold; and generate a proceed with execution notification for transmission via the network to the first storage unit of the first subset indicating a request to continue executing the access request when the missed deadline cost value compares unfavorably to the new request cost threshold.

\* \* \* \* \*